US008609473B2

(12) United States Patent
Lieu et al.

(10) Patent No.: US 8,609,473 B2
(45) Date of Patent: Dec. 17, 2013

(54) METHOD FOR FABRICATING A NEO-LAYER USING STUD BUMPED BARE DIE

(75) Inventors: Peter Lieu, Irvine, CA (US); James Yamaguchi, Laguna Niguel, CA (US); Randy Bindrup, Trabucco Canyon, CA (US); W. Eric Boyd, La Mesa, CA (US)

(73) Assignee: ISC8 Inc., Costa Mesa, CA (US)

( * ) Notice: Subject to any disclaimer, the term of this patent is extended or adjusted under 35 U.S.C. 154(b) by 108 days.

(21) Appl. No.: 13/271,797

(22) Filed: Oct. 12, 2011

(65) Prior Publication Data

US 2012/0068336 A1 Mar. 22, 2012

Related U.S. Application Data

(63) Continuation-in-part of application No. 13/230,369, filed on Sep. 12, 2011.

(60) Provisional application No. 61/406,642, filed on Oct. 26, 2010, provisional application No. 61/492,660, filed on Jun. 2, 2011, provisional application No. 61/403,519, filed on Sep. 17, 2010.

(51) Int. Cl.
H01L 21/00 (2006.01)

(52) U.S. Cl.
USPC ............... 438/127; 438/15; 438/16; 438/17; 438/109; 438/114; 438/118; 438/459; 438/613; 257/737; 257/790; 257/E21.502; 257/E21.529; 324/757.04; 324/757.05; 324/762.02; 324/762.06

(58) Field of Classification Search
USPC ............ 438/109, 114, 118, 127, 459, 613, 7, 438/10, 12, 15–17; 257/737, E21.502, 790, 257/E21.529–E21.531; 324/757.04, 324/757.05, 762.02, 762.06
See application file for complete search history.

(56) References Cited

U.S. PATENT DOCUMENTS

| | | | |
|---|---|---|---|
| 5,953,588 A | 9/1999 | Camien | |
| 6,002,592 A * | 12/1999 | Nakamura et al. | ............ 361/760 |
| 6,072,234 A | 6/2000 | Camien | |
| 6,117,704 A | 9/2000 | Yamaguchi | |
| 6,784,547 B2 | 8/2004 | Pepe | |
| 6,797,537 B2 | 9/2004 | Pepe | |
| 7,768,113 B2 | 8/2010 | Ozguz | |
| 2010/0151628 A1 * | 6/2010 | Kushima | ........................ 438/113 |

* cited by examiner

Primary Examiner — Kimberly Rizkallah
Assistant Examiner — Maria Ligai
(74) Attorney, Agent, or Firm — W. Eric Boyd, Esq.

(57) ABSTRACT

A method for fabricating a stackable integrated circuit layer and a device made from the method are disclosed. A stud bump is defined on the contact pad of an integrated circuit die and the stud-bumped die encapsulated in a potting material to define a potted assembly. A predetermined portion of the potting material is removed whereby a portion of the stud bump is exposed. One or more electrically conductive traces are defined on the layer surface and in electrical connection with the stud bump to reroute the integrated circuit contacts to predetermined locations on the layer to provide a stackable neolayer.

1 Claim, 3 Drawing Sheets

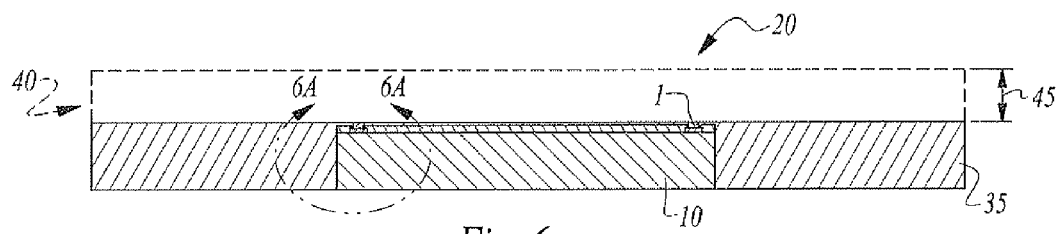
*Fig. 6*
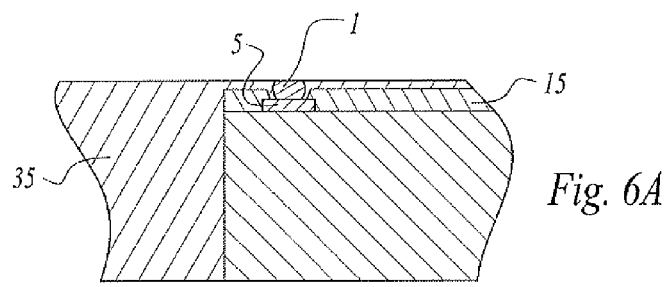
*Fig. 6A*
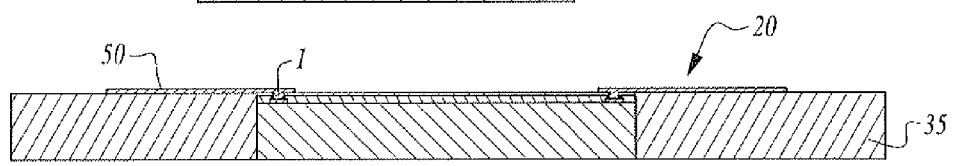
*Fig. 7*
*Fig. 8*
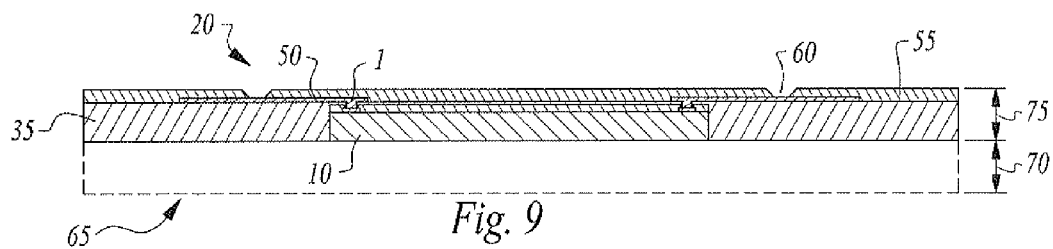
*Fig. 9*
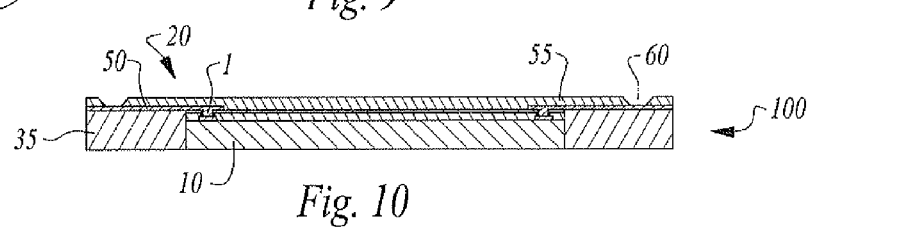
*Fig. 10*

METHOD FOR FABRICATING A NEO-LAYER USING STUD BUMPED BARE DIE

CROSS-REFERENCE TO RELATED APPLICATIONS

This application is related to and claims the benefit of U.S. Provisional Patent Application No. 61/406,642, filed on Oct. 26, 2010, pursuant to 35 USC 119, the entire contents of which is incorporated herein by reference.

This application is a continuation-in-part application of U.S. patent application Ser. No. 13/230,369, now pending, filed on Sep. 12, 2011 to Lieu et al., which in turn claims priority to U.S. Provisional Patent Application No. 61/492,660, filed on Jun. 2, 2011 and U.S. Provisional Patent Application No. 61/403,519, filed Sep. 17, 2010, pursuant to 35 USC 119, the entire contents of each of which are incorporated herein by reference.

STATEMENT REGARDING FEDERALLY SPONSORED RESEARCH AND DEVELOPMENT

N/A

BACKGROUND OF THE INVENTION

1. Field of the Invention

The invention relates generally to the field of stacked integrated circuits.

More specifically, the invention relates to using conductive stud bumps while processing bare integrated circuit die during neolayer lamination and potting for use in fabricating a stackable layer comprising one or more integrated circuit chips.

2. Description of the Related Art

The ability to fabricate very thin, stackable layers containing one or a plurality of homogeneous or heterogeneous integrated circuit chips is desirable and allows high density, high speed electronic systems to be assembled for use in military, space, security and other applications.

Examples of such layers and modules are disclosed in U.S. Pat. No. 6,072,234, Stack of Equal Layer Neo-Chips Containing Encapsulated IC Chips of Different Sizes; U.S. Pat. No. 6,797,537, Method of Making Stackable Layers Containing Encapsulated Integrated Circuit Chips With One or More Overlying Interconnect Layers; U.S. Pat. No. 6,784,547, Stackable Layers Containing Encapsulated Integrated Circuit Chips With One or More Overlying Interconnect Layers; U.S. Pat. No. 6,117,704, Stackable Layer Containing Encapsulated Chips; U.S. Pat. No. 5,953,588; Stackable Layers Containing Encapsulated IC Chips; and U.S. Pat. No. 7,768,113, Stackable Tier Structure Comprising Prefabricated High Density Feed-through.

The stacking and interconnection of very thin microelectronic layers permits high circuit speeds in part because of short lead lengths with related reduced parasitic impedance and reduced electron time-of-flight. These desirable features combined with a very high number of circuit and layer interconnections allow relatively large I/O designs to be implemented in a small volume.

The present invention provides a stackable integrated circuit chip (which integrated circuit chip is also herein referred to as an "IC" or "die") for use in multi-layer, microelectronic modules such as are disclosed in the above referenced patents. The use of potted and thinned stacked layers having rerouted die therein permits die having different functions, and therefore different areas, to be stacked as if they were same size die.

A prior art process for making a "neo-chip" or "neo-layer" involves the "potting" of individual IC chips in a encapsulant or compound which supports and insulates each chip and which can be cut or diced to provide equal area layers so that chips having different sizes can be stacked as layers whose edges are coplanar with one another. The individual chips, in die form, may be incorporated into neo-wafer form for processing. Thereafter, layers are cut out of the neo-wafer and incorporated into stacks.

The prior art neo-layer processes may include the processing and stacking of chips purchased as individual die. Beneficially, chips purchased as individual die are generally "known good" die which have been "burned in" and are therefore pre-tested prior to stacking.

Prior to stacking, one or more known good die are used to create the "neo" wafer by locating those known good die in a potting fixture. Potting material is flowed into the fixture, which is enclosed and then the potting material is cured. The resulting "neo-wafer" is removed from the fixture and then subjected to pre-stacking process steps including spinning on a layer of dielectric material, forming vias through the dielectric material to reach the terminals on the die in the wafer, and then forming electrical conductors in the form of metal traces that lead from the die terminals on the surface of the dielectric layer or layers. Thereafter the neo-wafer is diced into one or more layers suitable for stacking, each layer containing at least one known good die.

Each layer of a completed stack has electrical leads in the form of conductive metal traces used to connect the IC circuitry of the embedded chip (or chips) to one or more access planes, where the traces are available for connection to exterior circuitry.

Major cost-saving benefits can be obtained by the sole use of "known good" die, and the use/of a neo-wafer in processing one or more of such die.

Neo-stacking offers significant improvements over silicon bare die stacking, but it also proved troublesome under certain market circumstances. In particular, it is often difficult to buy bare die because many manufacturers will only sell packaged die.

For instance, when trying to buy bare DRAM die from a particular manufacturer, it was discovered that the manufacturer would not sell bare DRAM die, but would sell the DRAM die already pre-tested and installed in prepackaged integrated circuit packages.

Because of the demand for die and the high capital investment necessary to be a mass manufacturer of them, it is difficult to induce a mass fabricator of die to supply only die as opposed to the usual finished product which is a packaged or encapsulated integrated circuit chip. Such mass fabricators are typically fully occupied with the manufacture of finished and packaged integrated circuits. Individual IC chips are not typically offered for sale either in wafer or in die form.

Even in those cases where a mass fabricator can be induced to manufacture and sell a bare functional die, the die may be delivered in wafers or diced without testing. In other words, a die is normally tested after it is connected to its lead frame and packaged on a lead frame or in an encapsulant to ascertain whether it is operable as intended. Mass testing of bare die is not a procedure that many mass fabricators are equipped or even inclined to do. Therefore, a purchaser of bare die must test each die individually in order to determine its operability or the yield. Bare die testing is too limited to ensure acceptable yields, while comprehensive testing and burn-in renders bare die production cost-ineffective. These problems are sometimes referred to as the "known good die" or "KGD" problem.

Because prepackaged die are burned in and therefore contain known good die, it is desirable to depackage the known good die within a prepackaged IC package for use in certain applications such as for use in the above neo-processes.

Unfortunately, for both die obtained as bare die and depackaged die, during the processing steps of neowafer fabrication, certain elements of the bare die, particularly the aluminum contact pads, are prone to corrosion caused by chemicals used during lithography or elsewhere in the process; particularly corrosion on the side aluminum walls of the IC contact pads when nickel and palladium are present on the surface of the aluminum contact pads.

Additionally, some circuit elements on the bare die that are used in the neolayer process are sensitive to the radiation used in certain process steps and can be damaged by exposure thereto.

What is needed is a neolayer fabrication method that protects the aluminum IC pads from corrosion and any active IC circuit elements from radiation during processing and that provides a neolayer for use as a stackable layer in a multilayer electronic module.

BRIEF SUMMARY OF THE INVENTION

A method for fabricating a stackable integrated circuit layer and a device made from the method are disclosed. A stud bump is defined on the contact pad of an integrated circuit die and the stud-bumped die encapsulated in a potting material to define a potted assembly.

A predetermined portion of the cured potting material is removed whereby a portion of the stud bump is exposed. One or more electrically conductive traces are defined on the layer surface and are in electrical connection with the stud bump to reroute the integrated circuit contacts to predetermined locations on the layer.

In a first aspect of the invention, a method for fabricating a stackable integrated circuit layer is provided comprising the steps of defining a stud bump on the contact pad of an integrated circuit die, encapsulating the die in a potting material to define a potted assembly having an active surface and an inactive surface, removing a portion of the potting material from the active surface to a predetermined first depth whereby a predetermined portion of the stud bump is exposed on the active surface, and defining one or more electrically conductive traces on the active surface that are in electrical connection with the stud bump.

In a second aspect of the invention method may comprise the step of providing a post-potting dielectric layer.

In a third aspect of the invention, the method may comprise the step of defining a via in the post-potting dielectric layer to expose a portion of the electrically conductive trace.

In a fourth aspect of the invention, the method may comprise the step of back-thinning the inactive surface to a predetermined second depth to define a final layer thickness.

In a fifth aspect of the invention, a stackable integrated circuit layer is provided that is fabricated from a method comprising the steps of defining a stud bump on the contact pad of an integrated circuit die, encapsulating the die in a potting material to define a potted assembly having an active surface and an inactive surface, removing a portion of the potting material from the active surface to a predetermined first depth whereby a predetermined portion of the stud bump is exposed on the active surface, and defining one or more electrically conductive traces on the active surface that are in electrical connection with the stud bump.

In a sixth aspect of the invention, method for fabricating the layer further comprises the step of providing a post-potting dielectric layer.

In a seventh aspect of the invention, method for fabricating the layer comprises the step of defining a via in the post-potting dielectric layer to expose a portion of an electrically conductive trace.

In an eighth aspect of the invention, method for fabricating the layer comprises the step of back-thinning the inactive surface to a predetermined second depth to define a final layer thickness.

In a ninth aspect of the invention, a multilayer electronic module is provided comprising a plurality of stackable integrated circuit layers fabricated from a method comprising the steps of defining a stud bump on the contact pad of an integrated circuit die, encapsulating the die in a potting material to define a potted assembly having an active surface and an inactive surface, removing a portion of the potting material from the active surface to a predetermined first depth whereby a predetermined portion of the stud bump is exposed on the active surface, and, defining one or more electrically conductive traces on the active surface that are in electrical connection with the stud bump.

In a tenth aspect of the invention, the method for fabricating the layers of the module comprises the step of providing a post-potting dielectric layer.

In an eleventh aspect of the invention, the method for fabricating the layers of the module comprises the step of defining a via in the post-potting dielectric layer to expose a portion of an electrically conductive trace.

In a twelfth aspect of the invention, the method for fabricating the layers of the module comprises the step of back-thinning the inactive surface to a predetermined second depth to define a final layer thickness.

In a thirteenth aspect of the invention, a method for fabricating a stackable integrated circuit layer having a known good die with improved surface planarity is disclosed comprising the steps of providing a prepackaged integrated circuit package comprising an integrated circuit die, removing a predetermined portion of the package in a first operation to define a partially-depackaged integrated circuit die, affixing the partially-depackaged integrated circuit die and a spacer element having a predetermined thickness and a predetermined set of surface dimensions to a substrate whereby a least a portion of the spacer element is disposed between the partially-depackaged integrated circuit die and the substrate to define a convex, partially-depackaged integrated circuit die surface, removing a predetermined portion of the convex, partially-depackaged integrated circuit die surface in a second operation, defining a stud bump on the contact pad of the integrated circuit die, encapsulating the die in a potting material to define a potted assembly having an active surface and an inactive surface, removing a portion of the potting material from the active surface to a predetermined first depth whereby a predetermined portion of the stud bump is exposed on the active surface, and, defining one or more electrically conductive traces on the active surface and in electrical connection with the stud bump.

These and various additional aspects, embodiments and advantages of the present invention will become immediately apparent to those of ordinary skill in the art upon review of the Detailed Description and any claims to follow.

While the claimed apparatus and method herein has or will be described for the sake of grammatical fluidity with functional explanations, it is to be understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

BRIEF DESCRIPTION OF THE SEVERAL VIEWS OF THE DRAWINGS

FIG. 6 illustrates the potted die after it has been lapped to a predetermined first depth to expose a portion of a stud bump.

FIG. 6A is a view of 6A-6A.

FIG. 7 depicts the exposed stud bumps after electrically conductive reroute traces have been defined.

FIG. 8 illustrates the rerouted die of FIG. 7 having a post-potting dielectric layer defined over its active surface.

FIG. 9 shows the die assembly of FIG. 7 after back-thinning the inactive surface to a predetermined second depth.

FIG. 10 shows a preferred embodiment of the neolayer of the invention after it has been diced to a predetermined size.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE INVENTION

Turning now to the figures wherein like numerals define like elements among the several views, a method for fabricating a stackable integrated circuit layer using conductive stud bumps, such as gold stud bumps applied from a wire bonder, is disclosed. A layer and module fabricated from the method of the invention is also disclosed.

The invention addresses deficiencies in the prior art known to occur during the potting and lamination of bare integrated circuit die. The method of the invention addresses the prior art problem associated with integrated circuits that are susceptible to damage from UV radiation during neoprocessing by protecting active IC surfaces with a potting compound. The method of the invention also protects aluminum pads on bare integrated circuit die from corrosion caused by chemicals used during lithography or elsewhere in the neolayer process by minimizing corrosion on the side walls of aluminum IC contact pads when nickel and palladium are present on the surface thereof.

Figure 1:
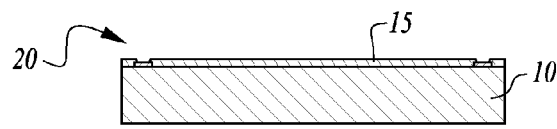
FIG. 1 shows a bare integrated circuit die.
Figure 2A:
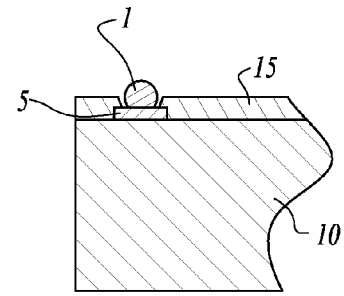
FIG. 2A is a view of 2A-2A of FIG. 2.
Figure 2:
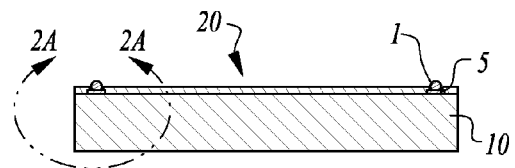
FIG. 2 shows a bare integrated circuit die with a stud bump applied to the contact pad of the die.

As illustrated in FIGS. 1, 2 and 2A, an electrically conductive stud bump 1, preferably comprised of a gold material, is defined on one or more contact pads 5 of a bare integrated circuit or "IC" die 10 such as by means of wire-bonder. Bare integrated circuit die 10 may comprise a pre-potting dielectric layer 15 disposed on the active surface 20 of die 10.

Suitable wire bond equipment to practice the process of the invention is available from West Bond, Inc. Stud bump 1 is preferably about 65μ in height.

In one embodiment of the invention, integrated circuit die 10 may be a depackaged, known good die or a depackaged, improved planar uniformity integrated circuit die, or both, that has been prepared by the process disclosed in U.S. patent application Ser. No. 13/230,369, entitled "Method for Depackaging Prepackaged Integrated Circuit Die and a Product Made from the Method", now pending.

In one aspect of the planarized depackaged known good die invention disclosed in the above referenced U.S. patent application Ser. No. 13/230,369, a process for providing an integrated circuit chip having improved planar uniformity from a prepackaged integrated circuit package is disclosed comprising the steps of providing a prepackaged integrated circuit package comprising an integrated circuit die, removing a predetermined portion of the package in a first operation to define a partially-depackaged integrated circuit die, affixing the partially-depackaged integrated circuit die and a spacer element having a predetermined thickness and a predetermined set of surface dimensions to a substrate whereby a least a portion of the spacer element is disposed between the partially-depackaged integrated circuit die and the substrate to define a convex, partially-depackaged integrated circuit die surface and removing a predetermined portion of the material to a predetermined depth from the convex, partially-depackaged integrated circuit die surface in a second operation.

The resultant depackaged die of the above process has improved planar uniformity and is well-suited for use in the instant method and device of the invention.

Figure 3:
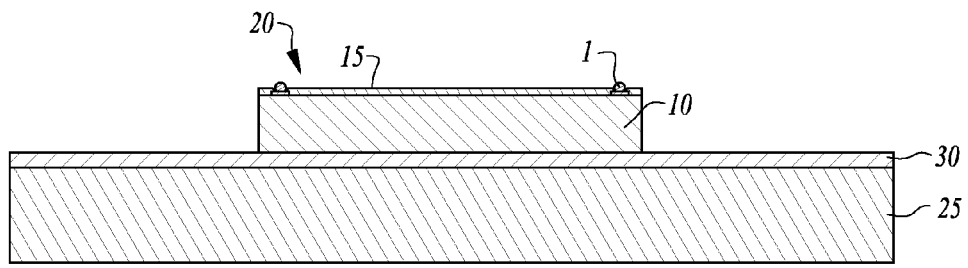
FIG. 3 illustrates the die of FIG. 2 bonded to a temporary carrier.

Turning now to FIG. 3, the die (or multiple die), are bonded with their active die surface(s) 20 face up, to a suitable temporary carrier 25. Suitable carriers include but are not limited to FR-4, PWB material; silicon, or aluminum carriers.

The die 10 are next bonded to carrier 25 using a suitable film or adhesive 30 that is compatible with the potting compound used in the subsequent steps in the process and is compatible with the temporary carrier 25 material selected for use in the previous step.

Figure 4:
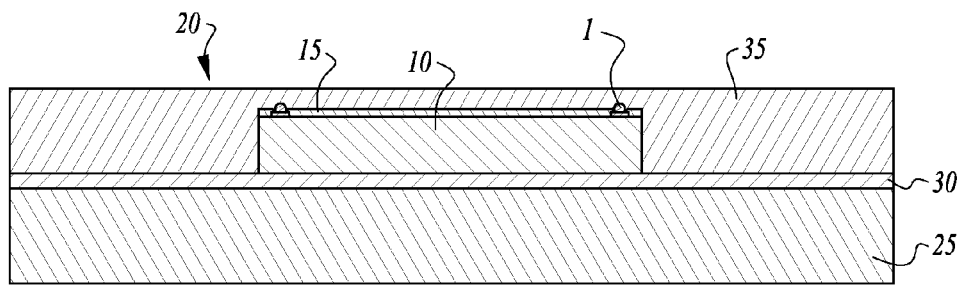
FIG. 4 depicts the die encapsulated in a potting material.

With respect to FIG. 4, die 10, which may be in the form of multiple die and is now bonded to carrier 25, is encapsulated in a potting material 35 or "potted" using a suitable potting encapsulant, which material may be a silica-filled epoxy. As is illustrated, once sufficient potting material 35 is added to the potting mold or fixture, the die and stud bumps 1 thereon are completely covered, i.e., encapsulated, beyond the upper surfaces of the stud bumps 1.

Figure 5:
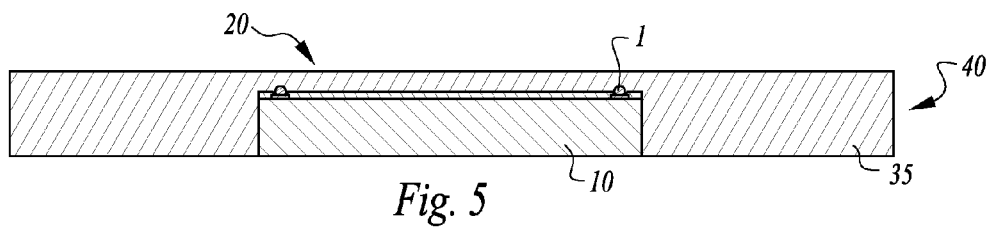
FIG. 5 shows the potted die released from the temporary carrier.
Figure 11:
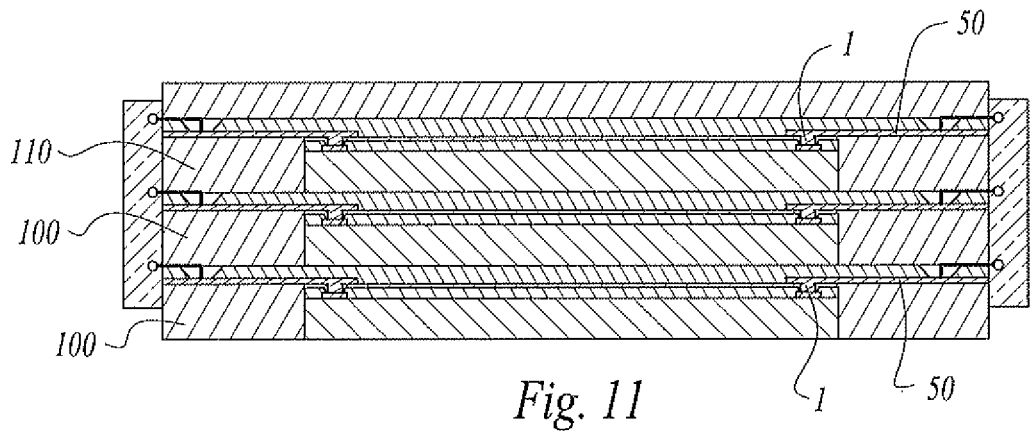
FIG. 11 illustrates a module comprised of integrated circuit layers fabricated from the method of the invention.
Figure 12:
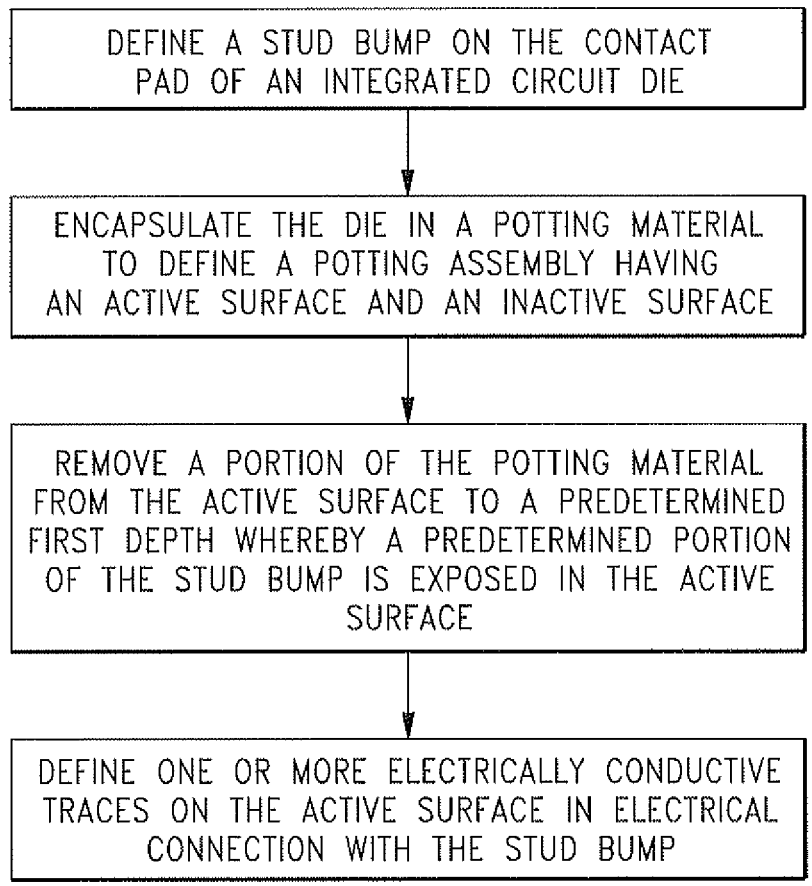
FIG. 12 is a set of steps illustrating a preferred embodiment of the method of the invention.

The potting compound is then "cured" per the manufacturer's specifications and the cured, potted assembly 40 released or removed from carrier 25 as seen in FIG. 5.

As depicted in FIGS. 6 and 6A, a portion of potting material 35 on active surface 20 is removed to a predetermined first depth 45 using a grinding, lapping or chemical-mechanical polishing (CMP) process until a predetermined portion of stud bump 1 is exposed for use as an electrical rerouting contact and preferably remains surrounded by a portion of potting material 35.

As best seen in FIG. 7, a first metal layer in the form on one or more metal, electrically conductive traces 50 are defined on active surface 20 to provide desired electrical reroutes and/or interconnections. Traces 50 are preferably delineated by photolithography and metal deposition and plating processes, or by equivalent means.

As illustrated in FIG. 8, a post-potting dielectric layer 55 is applied using suitable compounds including, but not limited to a polyimide-, BCB-, or epoxy-based compounds. If desired, one or more vias 60 may be defined or "opened" in dielectric layer 55 to permit the defining of addition metal trace elements that are in electrical connection with selected exposed metal trace portions or regions that are exposed within via 60.

At this stage, a post-potting dielectric layer is preferably applied if only two metal layers are required to achieve the necessary interconnections. Otherwise, as many metal and dielectric layers as desired can be applied by following the above steps for depositing metal and dielectric layers as is well-known in the photolithographic and plating fields.

Depending on the end use of the device, additional via structures and layers of dielectric material and metal traces may be deposited on the surface of the post-potting dielectric layer 55 by following the procedure described in the previous step to create a high density, high I/O multilayer conductive structure on the surface of die 10.

Turning to FIG. 9, after the last post-potting dielectric layer is cured, the inactive surface 65 of potted die assembly 40 is back-thinned to a predetermined second depth 70 to define a predetermined final layer thickness 75.

As shown in FIG. 10, the potted die assembly 40 is then diced to its final preferred dimensions to provide a stackable neolayer 100 comprising stud bumped bare integrated circuit die for use in stackable layers and stacked electronic modules.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. A method for fabricating a stackable integrated circuit layer comprising the steps of:
   providing a prepackaged integrated circuit package comprising an integrated circuit die,
   removing a predetermined portion of the package in a first operation to define a partially-depackaged integrated circuit die,
   affixing the partially-depackaged integrated circuit die and a spacer element having a predetermined thickness and a predetermined set of surface dimensions to a substrate whereby at least a portion of the spacer element is disposed between the partially-depackaged integrated circuit die and the substrate to define a convex, partially-depackaged integrated circuit die surface,
   removing a predetermined portion of the convex, partially-depackaged integrated circuit die surface in a second operation,
   defining a stud bump on a contact pad of the integrated circuit die,
   encapsulating the die in a potting material to define a potted assembly having an active surface and an inactive surface,
   removing a portion of the potting material from the active surface to a predetermined first depth whereby a predetermined portion of the stud bump is exposed on the active surface, and defining one or more electrically conductive traces on the active surface in electrical connection with the stud bump.

* * * * *